United States Patent
Vogt et al.

(10) Patent No.: US 6,628,930 B1
(45) Date of Patent: Sep. 30, 2003

(54) RADIO RECEIVER WITH TWO TUNERS AND A SWITCH FOR VERIFYING RECEPTION QUALITY AT AN ALTERNATIVE FREQUENCY

(75) Inventors: Lothar Vogt, Barienrode (DE); Karl-Heinz Black, Hildesheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/554,837

(22) PCT Filed: Nov. 2, 1998

(86) PCT No.: PCT/DE98/03192

§ 371 (c)(1),
(2), (4) Date: Jul. 13, 2000

(87) PCT Pub. No.: WO99/27667

PCT Pub. Date: Jun. 3, 1999

(30) Foreign Application Priority Data

Nov. 19, 1997 (DE) .......................................... 197 51 189

(51) Int. Cl.⁷ ................................................. H04B 1/18
(52) U.S. Cl. ....................... 455/131; 455/132; 455/133; 455/134; 455/313
(58) Field of Search ................................. 455/131, 132, 455/133, 134, 135, 313

(56) References Cited

U.S. PATENT DOCUMENTS

| 5,345,602 A | | 9/1994 | Wiedemann et al. |
| 5,430,890 A | | 7/1995 | Vogt et al. |
| 5,590,156 A | * | 12/1996 | Carney ........................ 375/316 |
| 6,141,536 A | * | 10/2000 | Cvetkovic et al. ............. 455/45 |
| 6,151,488 A | * | 11/2000 | Brekelmans .............. 455/150.1 |
| 6,272,191 B1 | * | 8/2001 | Inamori ....................... 375/348 |

FOREIGN PATENT DOCUMENTS

| DE | 41 04 882 | 8/1992 |
| EP | 0 333 194 | 9/1989 |

* cited by examiner

Primary Examiner—Nay Maung
Assistant Examiner—Alan T. Gantt
(74) Attorney, Agent, or Firm—Kenyon & Kenyon

(57) ABSTRACT

A radio receiver having a circuit arrangement for checking the quality of reception at an alternative frequency to a received transmit frequency. The radio receiver has two tuners for converting the received signals to two different intermediate frequencies and a switch, which is preferably switched by a microprocessor, for optionally forwarding signals from signal processing branches that are each connected to one of the tuners. This reduces the cost of implementing the second receiver, at the same time reducing the barely noticeable impairment of the set program when checking the quality of reception at the alternate frequency. The latter is achieved by positioning the switch upstream from an analog-digital converter, operating at a sampling frequency, of an intermediate frequency stage. The different intermediate frequencies are selected so that they both meet the following condition:

$$f_0 = (n+R)f_a$$

where n is a natural number, and $0 \leq R \leq 1$ applies. An intermediate frequency filter, a demodulator, possibly a decoder for additional signals, and a test unit for determining signal quality are connected to the analog-digital converter.

7 Claims, 1 Drawing Sheet

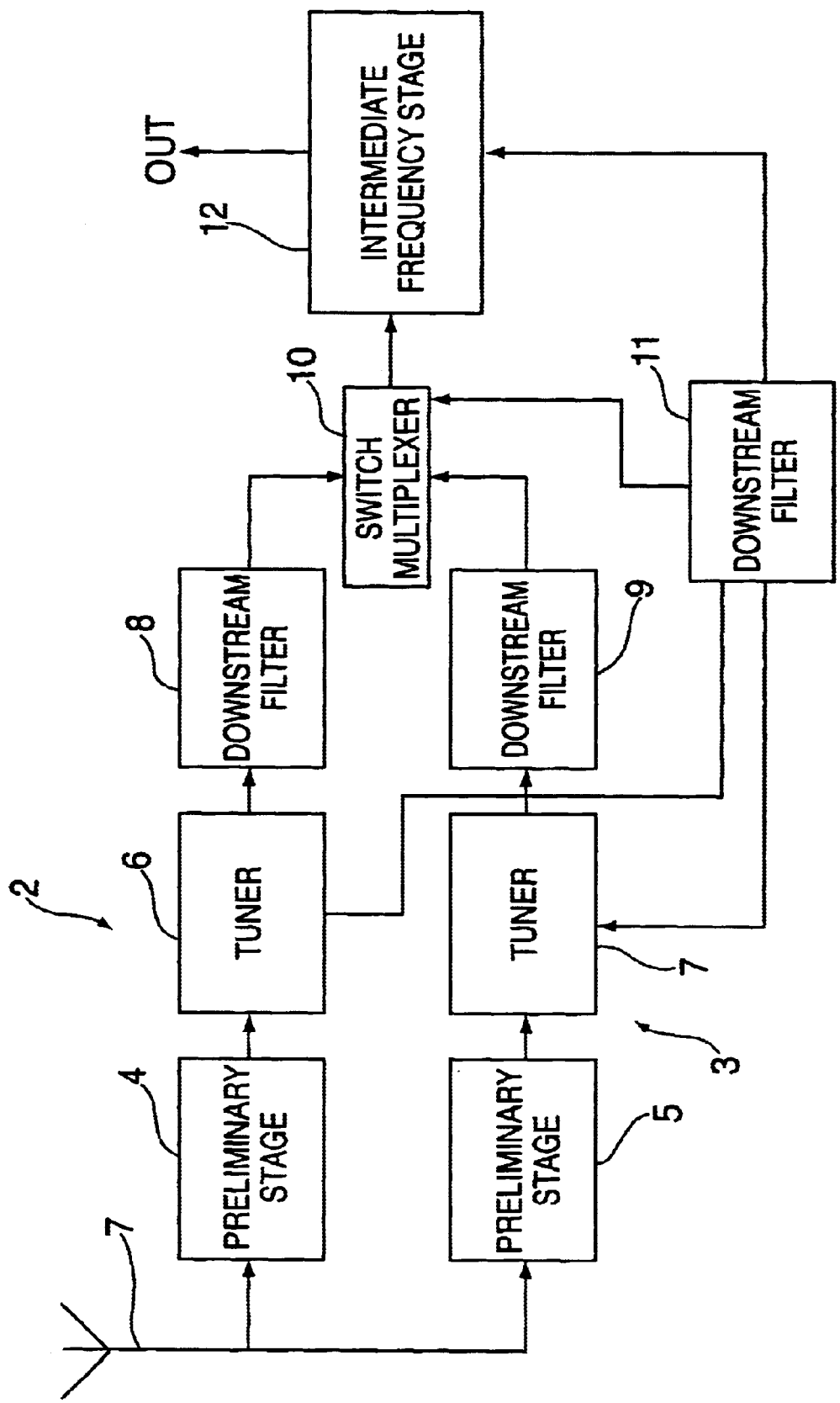

RADIO RECEIVER WITH TWO TUNERS AND A SWITCH FOR VERIFYING RECEPTION QUALITY AT AN ALTERNATIVE FREQUENCY

BACKGROUND INFORMATION

The present invention relates to a radio receiver having a circuit arrangement for checking the quality of reception at an alternative frequency to a received transmit frequency, having two tuners for converting the received signals to different intermediate frequencies and a switch for optionally forwarding signals from signal processing branches that are each connected to one of the tuners.

Modern radio receivers, particularly those used in multiple locations, as is preferably the case with car radios, are equipped with a circuit arrangement for checking the reception quality of a set station at an alternative frequency of this station. The information about alternative frequencies is generally derived from encoded information that is transmitted during a broadcast, for example using RDS (radio data system) signals. The reception quality at one or more alternative frequencies is checked either regularly or when the reception quality of the selected station at the set frequency deteriorates.

Known methods include equipping the radio receiver with two separate receivers for this purpose, with one receiver continuously selecting and checking alternative frequencies in the background. For isolation purposes and to avoid mutual disturbances, the two receivers have different intermediate frequencies. A microprocessor compares the quality of the station received by the background receiver at the alternative frequency with the set program. This background check is carried out without the user noticing any interruption in reception. However, this concept is relatively costly because both receivers must be fully equipped with tuners, IF filters, IF stages with demodulator, RDS decoders, signal quality test equipment, etc.

Another known method is to check the alternative frequencies using only one receiver. To do this, the tuner's PLL (phase-locked loop) briefly switches to an alternative frequency. Reception at the alternative frequency is checked and a determination is made as to whether or not the alternative frequency provides better reception than the frequency currently set. If reception at the alternative frequency is poorer, the receiver switches back to the original frequency and possibly checks another alternative frequency. Although this concept is more economical, it has the disadvantage that the check pauses and briefly, though noticeably, interrupts the program to which the user is listening.

According to the related art, therefore, a problem arises in that either the check of alternative frequencies can be carried out only at greater expense or, to reduce costs, the user must put up with a noticeable interruption in the program to which he is listening.

SUMMARY OF THE INVENTION

An object of the present invention is therefore to avoid the high cost of using two separate and fully equipped receivers and also to at least reduce interference with the received program.

According to the present invention, this object is achieved with a radio receiver of the type mentioned in the preamble by positioning the switch upstream from an analog-digital converter, operating at a sampling frequency ($f_a$), of an intermediate frequency stage; by selecting the different intermediate frequencies so that they both meet the following condition:

$$f_0 = (n+R)f_a$$

where n is a natural number, and $0 \leq R \leq 1$ applies; and an intermediate frequency filter, a demodulator, possibly a decoder for additional signals, and a test unit for determining signal quality are connected to the analog-digital converter.

According to the present invention, two tuners that convert the received signal to different intermediate frequencies are used, like in the concept with two receivers. However, both tuners are provided with a common intermediate frequency stage having an intermediate frequency filter, a demodulator, a decoder for additional signals, and a test unit for the signal quality, so that either the intermediate frequency of the one tuner or the intermediate frequency of the other tuner can be directed to the intermediate frequency stage via the switch, which is designed, for example, as a multiplexer. This is possible because the analog-digital converter operating at a sampling frequency ($f_a$) can digitize the different intermediate frequencies when both intermediate frequencies meet the following condition:

$$f_0 = (n+R)f_a$$

as is generally known from German Patent Application No. 41 04 882. This makes it possible, according to the present invention, to process both intermediate frequencies using the same intermediate frequency stage without any additional means.

To check the alternative frequencies, therefore, the switch, which is preferably controlled by a microprocessor, interrupts processing of the signals received by the set tuner, thus checking the alternative frequency. Unlike the concept using one receiver, the interruption needs to be carried out only for the brief check period, while the corresponding PLL must resonate to the new mixed frequency when a single tuner switches over, so that, when switching to an alternative frequency and then back to the original frequency, two transient responses lasting just milliseconds are added to the check time and form the overall interrupt time. The interruption produced according to the present invention is therefore shorter by at least a factor of 2 so that the interruption to the received program is barely noticeably. If the arrangement checks an alternative frequency that is known to have a usable reception quality, due to an earlier check, the interruption to the received program is not noticeable at all.

If, however, there is the possibility that the reception at the alternative frequency is very poor, possibly causing a very noisy signal to be received, it is suitable to mute the low-frequency channel for the brief check period to prevent any disturbing noise signals from passing through to the speaker.

Because the interruption during the check according to the present invention is so short that it does not noticeably disturb the received program, it may be suitable according to the present invention to create and store a displayable table of frequencies, i.e., stations, that can be received at the reception location by checking a multiplicity of frequencies, making it possible to select a specific number of suitable stations, i.e., transmit frequencies.

BRIEF DESCRIPTION OF THE DRAWINGS

The FIGURE shows a block diagram of a radio receiver according to the present invention.

DETAILED DESCRIPTION

One embodiment of the present invention is illustrated schematically in the FIGURE in the form of a block diagram. To a receiving antenna 1 are connected two parallel tuner branches 2, 3, each of which includes a preliminary stage 4, 5 that amplifies the receive signal, a connected tuner 6, 7, and a downstream filter 8, 9. Filters 8, 9 are not conventional intermediate frequency filters used to select the station on the receiving band converted by tuner 6, 7, but rather serve only to limit the band in order to cut off modulation-induced image frequencies and similar phenomena. The outputs of both filters 8, 9 are connected to two inputs of a switch 10 in the form of a multiplexer whose switching state is controlled by a microprocessor 11. Multiplexer 10 is normally connected so that the output signal of first tuner branch 2 is switched through by multiplexer 10 and thus reaches an intermediate frequency stage 12, which is designed as a highly integrated circuit and includes an analog-digital converter for the intermediate frequency, an intermediate frequency filter for making the selection, a digital demodulator, an RDS decoder, and a test unit for the signal quality. The signal quality is checked in an essentially known manner by checking the field strength, adjacent channel disturbances, multipath reception, an RDS error bit rate, etc.

A decline in the signal quality received via first tuner branch 2 is evaluated by microprocessor 11, causing microprocessor 11 to switch multiplexer 10 so that a signal received by tuner 7, which was previously set to an alternative frequency by microprocessor 11, now reaches intermediate frequency stage 12 at the intermediate frequency of second tuner branch 3 via multiplexer 10.

The analog-digital converter of intermediate frequency stage 12 uses, for example, a sampling frequency of 14.25 MHz and is therefore suitable for digitizing an intermediate frequency signal at a frequency of 10.6875 MHz at the output of first tuner branch 2 as well as an intermediate frequency of 67.6875 MHz at the output of second tuner branch 3, since these two intermediate frequencies meet the following condition:

$$f_o = (n+R)f_a$$

where n=0 and R=0.75 for first tuner branch 2 and n=4 and R=0.75 for second tuner branch 3.

The reception quality at the alternative frequency is checked by intermediate frequency stage 12 and evaluated by microprocessor 11 so that, upon detecting a better reception quality, multiplexer 10 remains switched, while a poorer reception quality causes multiplexer 10 to switch back to the output signal of first tuner branch 2. In this case, this can be followed by a check of a further alternative frequency in second tuner branch 3. In addition, the signal quality of alternative station frequencies can be checked at specific time intervals (for example, every five minutes), thereby continuously optimizing reception.

Microprocessor 11 generally receives the information about possible alternative frequencies from the RDS signal that is decoded in intermediate frequency stage 12 and regularly includes a transmission of information about alternative frequencies. However, it is also possible to create and store a table of receivable frequencies and transmitted station IDs by having microprocessor II sample numerous frequencies on the radio frequency band, so that possible alternative frequencies can also be derived from this table. However, the main function of the table is to help the user operate the car radio by displaying, for example, the stations that can be received at the reception location on a screen and possibly allowing the user to select them directly. As shown in the FIGURE, both tuners 6, 7 can be set to the desired receiving frequencies by microprocessor 11.

Because microprocessor 11 can set the PLLs included in both tuners 6, 7 before multiplexer 10 switches, transient responses of the PLL of tuner 6, 7, which is not currently switched through to intermediate frequency stage 12 by multiplexer 10, do not impair the audible signal.

Compared to the concept with one receiver, the cost of the circuit arrangement according to the present invention involves the provision of a second preliminary stage, a second tuner, and a band limiting filter and is therefore comparatively low, since the much higher cost of intermediate frequency stage 12 is not doubled. However, the relatively low additional cost makes it possible to considerably reduce radio reception disturbances caused by checking alternative frequencies. The use of two different intermediate frequencies avoids disturbances caused by cross coupling and crosstalk, which would occur when using a shared intermediate frequency.

What is claimed is:
1. A radio receiver, comprising:
   a circuit for checking a quality of reception at an alternative frequency to a received transmit frequency;
   a first signal processing branch;
   a first tuner connected to the first signal processing branch and for converting a received signal to a first intermediate frequency;
   a second signal processing branch;
   a second tuner connected to the second signal processing branch and for converting the received signal to a second intermediate frequency that is different than the first intermediate frequency;
   an intermediate frequency stage including an analog-digital converter operating at a sampling frequency;
   an intermediate frequency filter connected to the analog-digital converter,
   a demodulator connected to the analog-digital converter;
   a test unit connected to the analog-digital converter and for determining a signal quality; and
   a switch positioned upstream from the analog-digital converter and for optionally forwarding the received signal from the first signal processing branch and from the second signal processing branch, wherein:

the first intermediate frequency and the second intermediate frequency meet the condition $f_0=(n+R)f_a$, $f_0$ corresponds to a respective one of the first intermediate frequency and the second intermediate frequency, $f_a$ is the sampling frequency, n is a positive, whole number, and $0 \leq R \leq 1$ applies.

2. The radio receiver according to claim 1, wherein:

the intermediate frequency stage includes a decoder for additional signals.

3. The radio receiver according to claim 1, further comprising:

a low-frequency channel connected to the intermediate frequency stage and capable of being muted according to a mute function while the switch switches to the alternative frequency.

4. The radio receiver according to claim 3, wherein:

the mute function is capable of being deactivated if an ability to receive the alternative frequency has already been established.

5. The radio receiver according to claim 1, wherein:

a displayable table of transmit frequencies that can be received at a reception location can be created and stored by checking a plurality of transmit frequencies.

6. The radio receiver according to claim 1, wherein:

the switch is capable of being switched by the test unit if the signal quality of the received transmit frequency deteriorates.

7. The radio receiver according to claim 1, wherein:

the switch is capable of being switched to one of the first tuner and the second tuner receiving the alternative frequency at fixed time intervals.

* * * * *